United States Patent [19]
Yang

[11] Patent Number: 4,864,626

[45] Date of Patent: Sep. 5, 1989

[54] VOICE MODIFIER

[76] Inventor: Pei-Chuan Yang, 4Fl., No. 100, C32g-Kuo Rd., Hsinchu City, Taiwan

[21] Appl. No.: 277,972

[22] Filed: Nov. 30, 1988

Related U.S. Application Data

[63] Continuation-in-part of Ser. No. 116,205, Nov. 3, 1987, abandoned.

[51] Int. Cl.[4] .......... H03G 3/00; H03G 3/20

[52] U.S. Cl. .......... 381/61; 84/DIG. 4; 381/110; 379/88

[58] Field of Search .......... 381/61-63, 381/51-53, 95, 110-111; 84/DIG. 4, 1.24, DIG. 26; 379/88

[56] References Cited

U.S. PATENT DOCUMENTS

| | | | |
|---|---|---|---|
| 4,021,613 | 3/1977 | Kennedy | 381/62 |
| 4,275,267 | 6/1981 | Kurtin et al. | 84/DIG. 26 |
| 4,389,915 | 6/1983 | Bione | 84/DIG. 4 |
| 4,392,405 | 7/1983 | Franz et al. | 84/1.24 |
| 4,569,268 | 2/1986 | Futamase et al. | 381/62 |
| 4,624,012 | 11/1986 | Lin et al. | 381/51 |
| 4,682,362 | 7/1987 | DeFreitas et al. | 381/61 |

*Primary Examiner*—Jin F. Ng
*Assistant Examiner*—David H. Kim
*Attorney, Agent, or Firm*—Morton J. Rosenberg

[57] ABSTRACT

An electrical device for voice modifier having an analog to digital converter for encoding an input signal into a digital signal, a memory unit for the storage of the encoded digital signal, a digital to analog converter for decoding the digital signal into an analog signal, and a clock generator for generate two different clock, namely, the encoding clock and decoding clock. The decoding clock is higher (or lower) than the encoding clock so that the output signal is different from the input signal. The voice modifier can transpose or distort one voice into another voice; e.g., the produced voice signal is understable, but not identifiable.

9 Claims, 8 Drawing Sheets

RF1 > TF1

TF2 > RF2

VOICE MODIFIER

This case is a continuation in part of the U.S Pat. application Ser. No. 07/116,205 filed 11-3-87, now abandoned.

BACKGROUND OF THE INVENTION

The present invention relates to a voice modifier, and more particularly relates to a voice modifier which can transpose or distort one voice into another voice by receiving the input audio signals with normal frequency and transmitting the output audio signals with different or unusual frequencies.

Heretofore, the concepts involving speech sampling and companding, and the variation of the frequencies in clock signals have been developed in many parts of the world. For example, U.S. Pat. No. 4,682,362 to DeFreitas et al., entitled "Generating Narrowly-separated Variable-frequency Clock Signals", discloses circuitry for generating clock signals of slightly different frequencies in which an analog to digital converter, a memory and a digital to analog converter are provided. A primary objective of the prior art is to produce a flange effect between the analog output signal and input signal. This is achieved by the employment of at least one of the clocks having a variable frequency provided by a voltage-to-frequency converter driven by the output of an integrator, which is supplied with the sum of a frequency-difference-command signal (supplied by a supervising microprocessor) and a difference signal representative of the actual difference in frequency between the two clocks. Data is written into memory at the address specified by encoding pointer, and data is read from the memory at the address specified by decoding pointer. It should be noted that the speed of the encoding pointer is set by fixed encoding clock and is constant; changes in delay are brought about by slightly varying the decoding clock relative to the encoding clock, under control of a microprocessor. Comprehensively, the decoding pointer has to trail behind the encoding pointer by the time period of the delay; moreover, the longer the of delay is, the more memory capacity is needed to store the signals.

Unlike the prior art, which discloses circuitry to control the clocks in a system for providing variable delay of an audio signal, the encoding pointer and decoding pointer used in the present invention are independent and different to produce a transposing or distorting effect on audio signal. The features of this invention can be easily realized by explaining the operation of a phonograph.

As is well known, if a phonograph record is played at 33⅓ RPM, it will create a much different effect than if it is played at 45 RPM. So obviously, one means of modifying the quality of a voice would be to transmit the audio signals at a frequency higher or lower than the receiving frequency, for example, twice or half the receiving frequency. For the purpose of further understanding the teaching of this invention, the basic concept and basic block diagram thereof are shown hereinafter with brief description.

FIG. 1A is a graph illustrating the relation between voltage and time of an input signal waveform, and FIG. 1B is a similar graph with a transmitting frequency equal to twice the transmitting frequency of FIG. 1A. When at time T, the position of voltage of FIG. 1B with respect to time is equivalent to the position of voltage of FIG. 1A corresponding to time 2T.

More specifically, FIG. 2 schematically illustrates a signal process for a voice modifier comprising an analog to digital (A/D) converter 62 which converts an analog signal 61 into a digital signal, a memory unit 63 which stores the digital signal, a digital to analog (D/A) converter 64 which converts the stored digital signal into an analog signal, and an amplifier 65. The voice modifier has a transmitting frequency f2 higher/lower than the receiving frequency f1 so that the output signal is different from the input signal.

The concepts of over-write and over-read are involved in this invention to solve the demand of an infinite memory when the encoding pointer is far ahead the decoding pointer (i.e., receiving frequency>>transmitting frequency) and the stack of digital signals being stored is increasing with time, since the decoding pointer is independent from the encoding pointer. Moreover, a continuous variable-slope delta modulation (CVSD), adaptive delta modulation (ADM), or delta modulation (DM) system is employed in this invention for designing D/A and A/D converters to smooth the discontinuous portions resulting from over-write or over-read.

SUMMARY OF THE INVENTION

A primary objective of the present invention is to provide a voice modifier which can transpose or distort one voice into another voice.

Another objective of the present invention is to provide a voice modifier which can be applied to telephones, microphones, loudspeakers and so on.

Still another objective of the present invention is to provide a voice modifier which, when mounted on a telephone, prevents the person receiving the call from recognizing the caller's voice.

Further objectives and advantages of the present invention will become apparent as the following description proceeds, and the features of novelty which characterize the invention will be pointed out with particularity in the claims annexed to and forming a part of this invention.

DETAILED DESCRIPTION OF THE PREFERRED EMBODIMENT

Figure 1A:
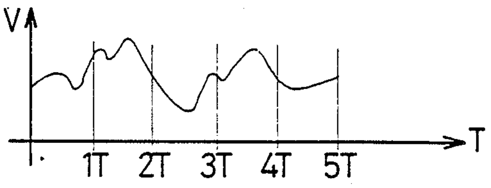
FIG. 1A PRIOR ART
FIG. 1A is a graph illustrating the relation between voltage and time for an audio input signal waveform.
Figure 1B:
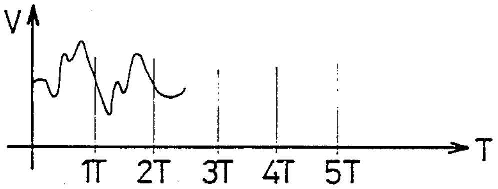
FIG. 1B PRIOR ART
FIG. 1B is another graph illustrating the relation between voltage and time for an audio input signal waveform similar to that shown in FIG. 1A, but with a higher transmitting frequency.
Figure 2:
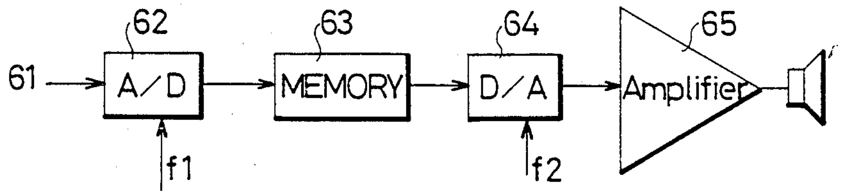
FIG. 2 PRIOR ART
FIG. 2 is a basic block diagram for processing an audio signal.
Figure 3:
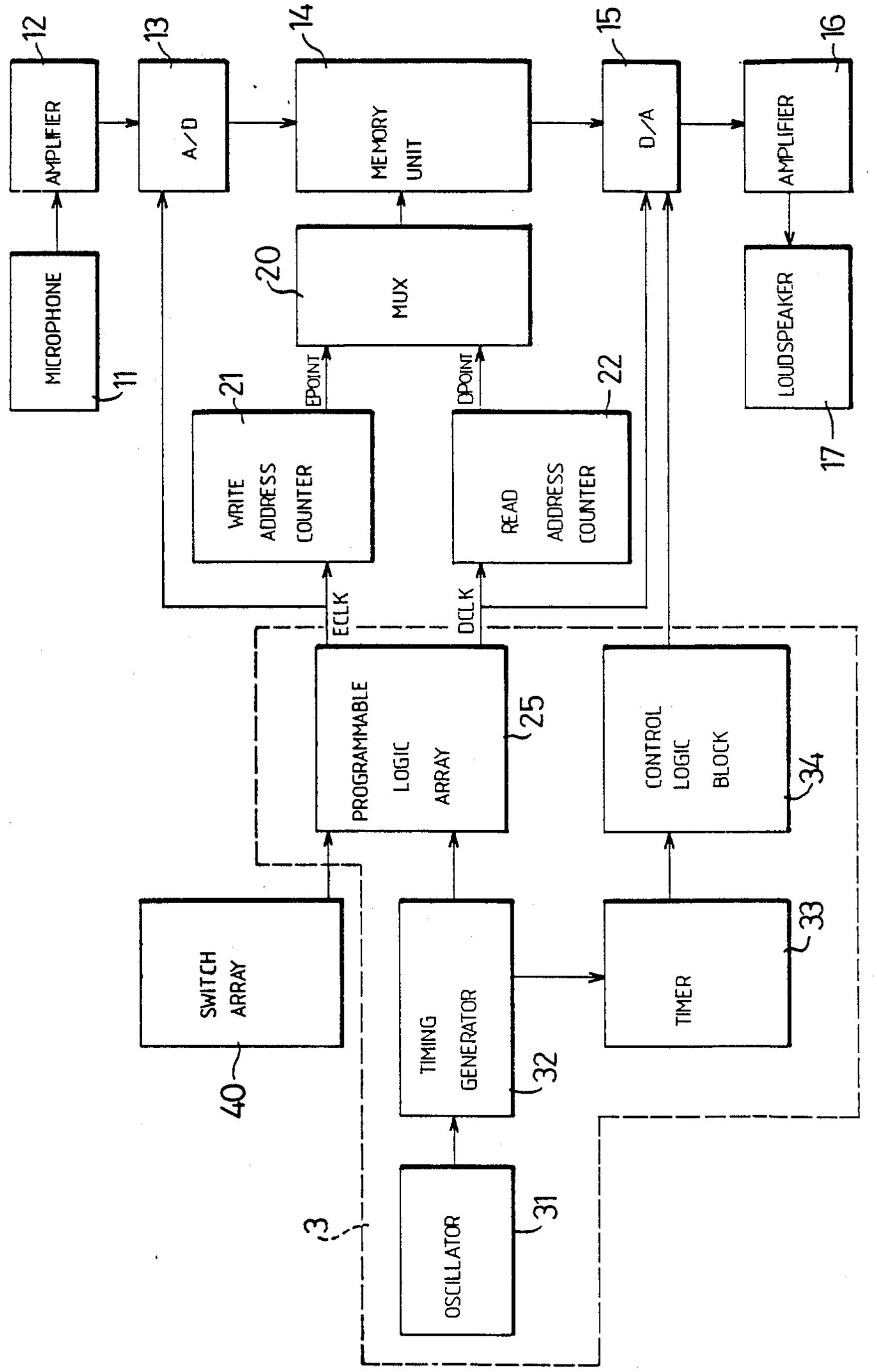
FIG. 3 is a block diagram illustrating a signal process for voice modification.
Figure 4A:
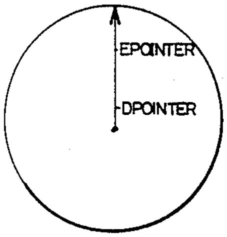
FIGS. 4A to 4D are diagrammatic representations showing the relation between the encoding pointer and decoding pointer, in which the encoding pointer is ordinarily ahead of the decoding pointer.
Figure 4B:
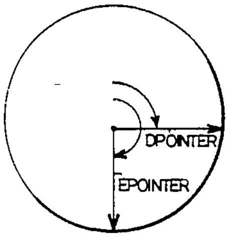
Figure 4C:
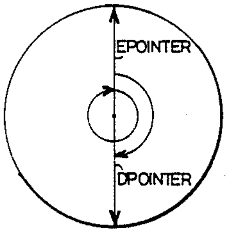
Figure 4D:
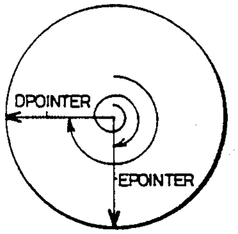

With reference to the drawings and particularly to FIG. 3 thereof, a block diagram illustrating one preferred embodiment of an electrical device of a voice modifier in accordance with the present invention can be seen. The process used in FIG. 3 is similar to that shown in FIG. 2 and further similar to FIG. 1 of U.S. Pat. No. 4,682,362, as heretofore stated. For example, analog to digital converter 13 converts analog input signal to a digital signal, which is written into a memory unit 14 (a static random access memory, a dynamic random access memory or a register) at the address specified by an encoding pointer EPOINTER. After control processes, which will be detailed hereinafter, the analog output signal is generated by a digital to analog converter 15, using digital output signal, which is read from memory unit 14 at the address specified by a decoding pointer DPOINTER. The analog input signal is preprocessed by a first amplifier 12 via a low-pass filter from a microphone 11, and the analog output signal from the D/A converter 14 is further processed by a second amplifier 16 and then transmitted by a loudspeaker 17 (or the like).

A multiplexer 20 alternately connects DPOINTER and EPOINTER to the address input of the memory unit 14. The encoder pointer EPOINTER is created by a write address counter 21 which is incremented at an appropriate period by encoding clock ECLK, supplied by a programmable logic array 25. Similarly, the decoder pointer DPOINTER is created by a read address counter 22 which is incremented at another appropriate period by decoding clock DCLK, supplied by the programmable logic array 25. Furthermore, the encoding clock ECLK and the decoding clock DCLK are respectively sent to the A/D converter 13 and the D/A converter 15 to actuate the operation of converters 13 and 15.

A clock generator 3 which operates the control processes comprises an oscillator 31, a timing generator 32 and the programmable logic array 25 to generate two different clocks, namely, the encoding clock and decoding clock. The programmable logic array 25 is further controlled by a switch array or push button 40 for adjusting the decoding clock with respect to the encoding clock. The switch array 40 utilizes an oscillator, a variable resistor means or a divider to generate the decoding clock different from the encoding clock. Since switch array technology and construction are well-known in the art, further discussion and description are not considered necessary at this time. The clock generator 3 additionally comprises a timer 33 for instructing the digital to analog converter 15 to transmit a signal indicating a silence via a control logic block 34 when no signal with sufficient intensity is read by A/D converter 13 for a long period of time.

The concepts of over-write and over-read are employed in this application to solve the previous problem demand of an infinite memory requirement, since the transmitting (converting) frequency of the decoding clock DCLK is possibly ahead of the receiving (sampling) frequency of the encoding clock ECLK. Over-write (or over-read) means that when the address pointer, which designates the address position of data to be written (or read) in the write address counter 21 (or the read address counter 22), points to the highest byte (i.e., FFFF) of the memory, the address pointer will automatically point back to the lowest byte (i.e., 0000) of the memory when the address is incremented by one. This makes a cycle for the memory block and results from the transmitting frequency being independent from the receiving frequency; however, the transmitting and receiving frequencies have to be defined within an acceptable range.

Figure 5A:
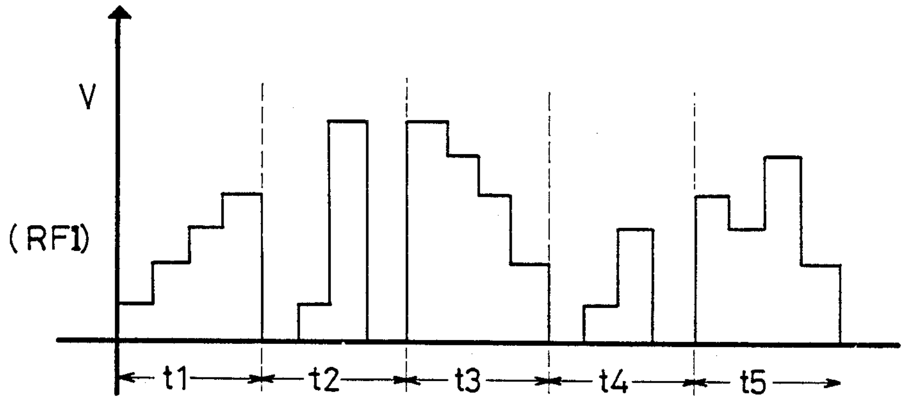
FIGS. 5A and 5B respectively represent the written waveform and read waveform with reference to FIGS. 4A to 4D.
Figure 5B:
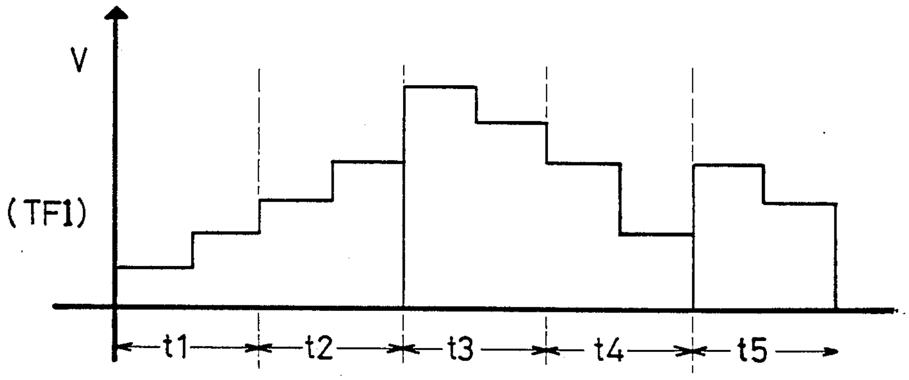

For convenience of explanation, an unit cycle with the EPOINTER and DPOINTER is used to simulate the data written into and read from the memory. Operation of the preferred embodiment can be understood with a first situation shown in FIGS. 4A to 4D in view of 5A and 5B. Data is written into the memory at the address specified by encoding pointer EPOINTER, and data is read therefrom at the address specified by decoding pointer DPOINTER. In the first situation, when receiving (sampling) frequency RF1 > transmitting (converting) frequency TF1, for example, RF1 = 2 TF1, FIGS. 4A to 4D diagrammatically represent the relation therebetween. Obviously, EPOINTER and DPOINTER would meet again after EPOINTER traveling two rounds of the unit cycle and DPOINTER traveling one round of the unit cycle in which "a round" shown in FIGS. 4A to 4D can be considered as the period from "t1 to t2" or "t3 to t4" shown in FIGS. 5A and 5B. As can be seen in FIGS. 5A and 5B, the waveforms in FIG. 5A are cut in half and then amplified twice in the corresponding periods of FIG. 5B due to the difference between the receiving and transmitting speeds.

Figure 6A:
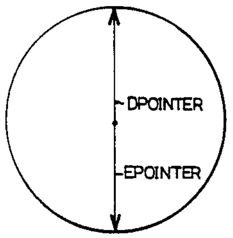
FIGS. 6A to 6D are another group of diagrammatic representations similar to FIGS. 4A to 4D, but wherein the decoding pointer is ahead of the encoding pointer.
Figure 6B:
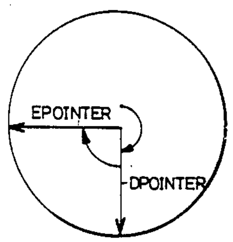
Figure 6C:
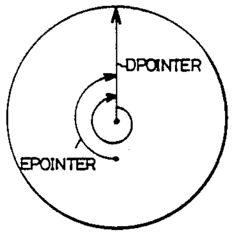
Figure 6D:
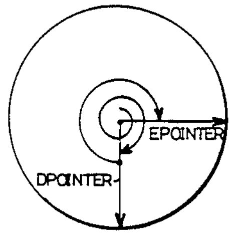
Figure 7A:
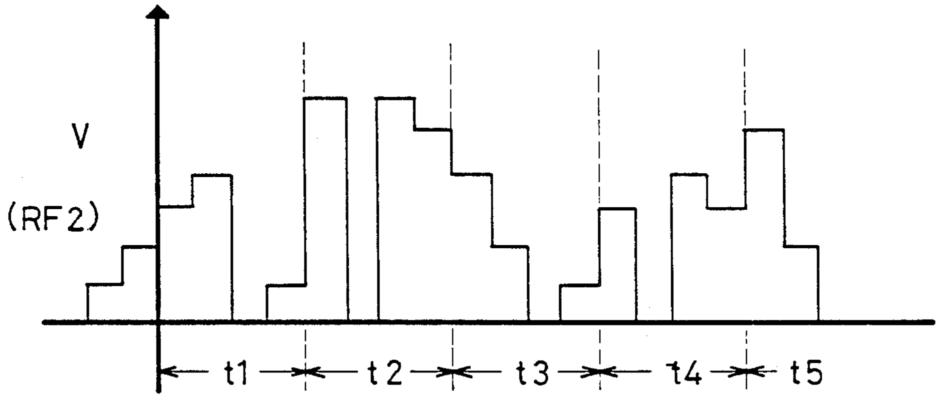
FIGS. 7A and 7B are waveforms similar to FIGS. 5A and 5B, but with reference to FIGS. 6A to 6D.

Similar to the first situation, a second situation, when TF2 > RF2, for instance, TF2 = 1 RF2, is realized with reference to FIGS. 6A to 6D in view of 7A and 7B. The EPOINTER and DPOINTER, in FIG. 6A, do not start at the same point, and the waveform shown in FIG. 7B has a corresponding shift regarding that shown in FIG. 7A, since the transmitting frequency TF2 is ahead of the receiving frequency RF2. Likewise, EPOINTER and DPOINTER return to their initial state as shown in FIG. 6A, after DPOINTER travels two rounds of the unit cycle and EPOINTER travels one round of the unit cycle. The second situation is different from the first situation at the point that the waveforms in FIG.

Figure 7B:
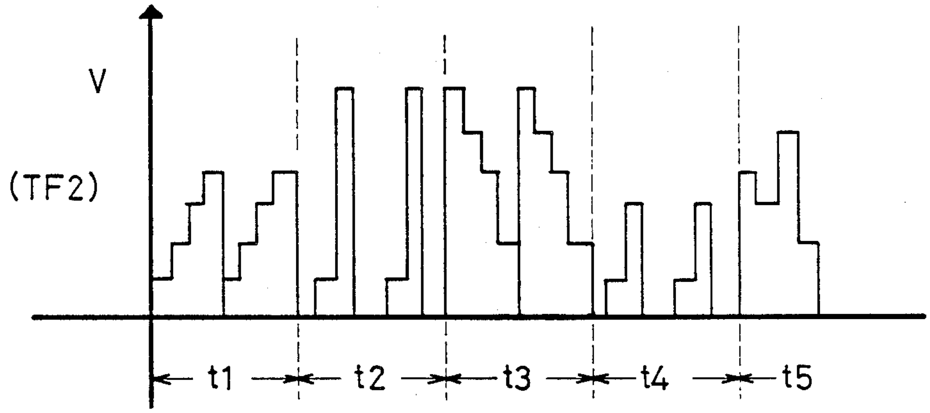

7A are shortened and repeated in the next periods of FIG. 7B.

It should be understood that although the method of pulse code modulation is employed in the above-mentioned drawings; i.e., FIGS. 5A, 5B, 7A and 7B, one bit encoder system (a continuous variable-slope delta modulation (CVSD), adaptive delta modulation (ADM), or delta modulation (DM) system) is needed to this invention to design D/A converter since there are many discontinuities in the decoded waveforms resulted from over-writing or over-reading. Due to the limitation of the slew rate, the one bit encoder system cannot respond to a great voltage difference in the waveform, therefore, the system must smooth the waveforms. Employed in this invention, a low-pass filter in the amplifier 16 smoothes the analog signal which is transmitted by a loudspeaker 17.

Although the DCLK and ECLK are independent of each other, some limitations must be placed on the DCLK so that after the D/A converter 15 generates the audio signal with some distortion, it will still be understandable, but not identifiable. This is done by choosing appropriate time intervals in the waveform of the input voice signal, which correspond to human voice frequencies, and then: (1) repeating the parts of voice signal at a certain interval; or (2) clipping some portion of the voice signal. For example, after clipping, other portion of the voice signal is left over and doubled in a corresponding interval, as shown in FIG. 5B.

Figure 8:
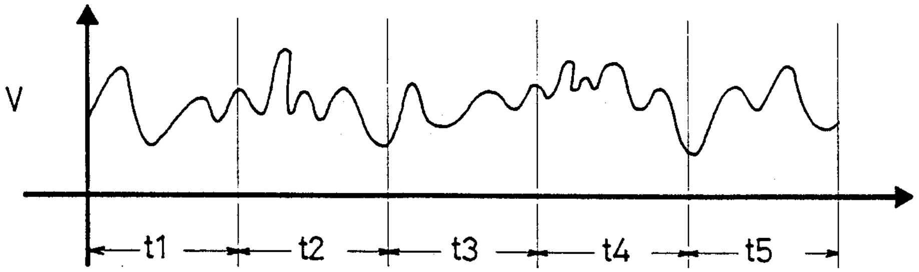
FIG. 8 is a graph illustrating a series of input audio signals with respect to voltage and time, wherein the input audio signal is divided into several sections with waveform 1 at interval t1, waveform 2 at interval t2, waveform 3 at interval t3, waveform 4 at interval t4, waveform 5 at interval t5, and so on for sake of convenience.
Figure 9:
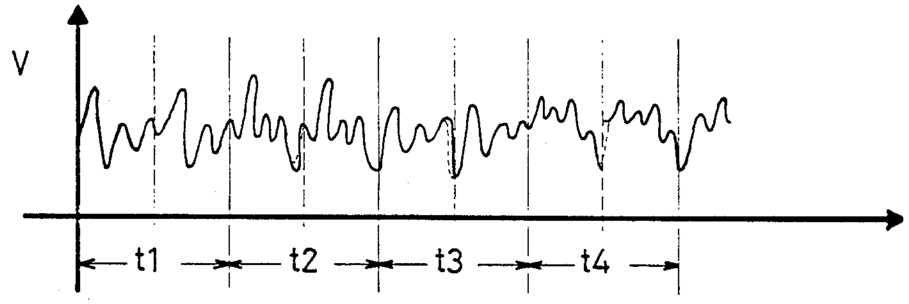
FIG. 9 is another graph similar to FIG. 8, but illustrating that the waveforms 1–4 are repeated at intervals 1–4, respectively, with transmitting frequency of FIG. 9 equal to twice that of FIG. 8.
Figure 10:
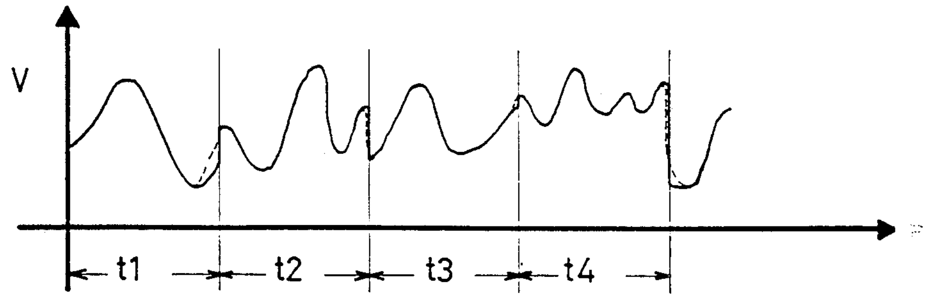
FIG. 10 is still another graph similar to FIG. 8, but illustrating that waveforms 1–4 are cut in half and amplified twice at intervals 1–4, respectively, with transmitting frequency of FIG. 10 half to that of FIG. 8.

Particularly referring to FIG. 8, for convenience of explanation, a series of input signals is divided into several sections with waveform 1 at interval t1, waveform 2 at interval t2, waveform 3 at interval t3, waveform 4 at interval t4, waveform 5 at interval t5, and so on. It should be noted that in actual situations, the waveform shown in the right side at each interval is very similar to one other; therefore, the distortion on the above-mentioned waveform will not make the voice signal undistinguishable. As shown in FIG. 9, when the transmitting frequency is at a rate equal to twice the receiving frequency, waveforms 1–4 are respectively repeated at intervals 1–4, wherein the signal, shown in dotted lines, output from the D/A converter is smoothed by a finite slew rate D/A modulation system as mentioned heretofore. If the transmitting frequency is at a rate equal to half the receiving frequency, as shown in FIG. 10, waveforms 1–4 are cut in half and then amplified twice at intervals 1–4, respectively; moreover, the signal output from the D/A converter is smoothed as shown in dotted lines.

Figure 11:
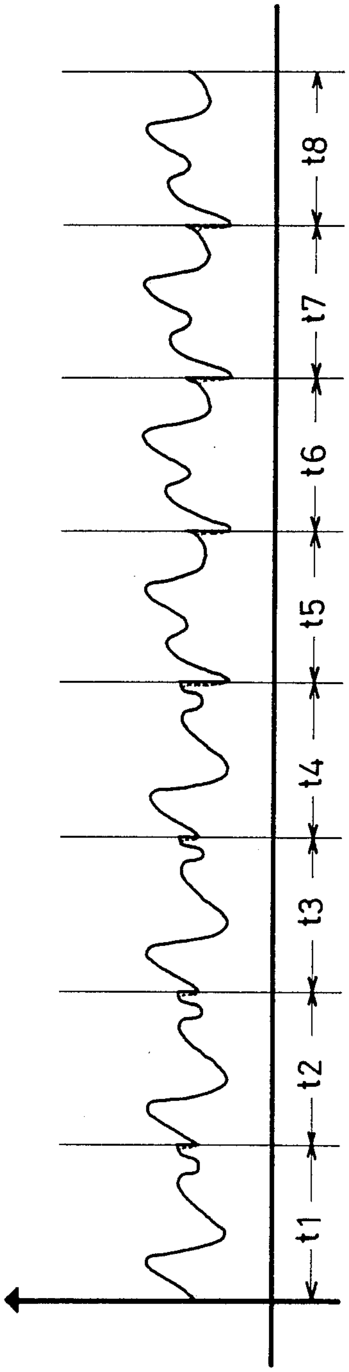
FIG. 11 is another graph illustrating that waveform 1 is repeated separately at intervals 1, 2, 3 and 4, and illustrating that waveform 5 is repeated separately at intervals 5, 6, 7 and 8.

FIG. 11 is another case, in which the present invention performs the special effect of converting an audio signal into a robot-like audio signal. This effect is attained by repeating the waveform 1 separately at intervals 1 to 4, and also repeating the waveform 5 separately at intervals 5 to 8.

Figure 12:
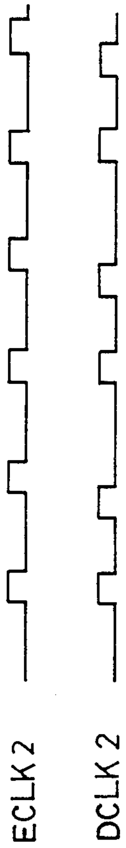
FIG. 12 is a waveform for a second encoding clock 2 and a second decoding clock 2, wherein a pulse of the second decoding clock is not spaced from its preceding pulse and from its subsequent pulse by the same time interval.

Referring to FIG. 12, it can be seen that another preferred embodiment of this application is attained by employing an encoding clock ECLK2 being at formal interval, and a pulse of another decoding clock DCLK2 being not spaced from its precedent pulse and from its subsequent pulse by the same time interval, so that only every other pulse of the decoding clock DCLK2 coincides with the encoding clock ECLK2. The employment of the informal transmitting frequency of the decoding clock DCLK2 can attain the function of voice modification; namely, the output signal is processed by alternatively higher and lower transmitting frequences of the decoding clock different from the receiving frequency of the encoding clock. The coincidence of one out of two pulses of the decoding clock to respective pulse of the encoding clock is to prevent an unrecognized output signal, i.e., become "synchronous".

It must be pointed out that a voice modifier in accordance with the present invention can be made according to at least three methods. The first method is to set the transmitting frequency at a rate higher or lower than the receiving frequency (for example, twice than the receiving frequency) and to repeat the waveform at the same interval. The second method is to employ an informal decoding clock, of which one out of two pulses coincides with corresponding encoding clock. The third method is to combine the above-mentioned first and second methods together.

The above examples and description have been given for purposes of illustration, and are not intended to be limitative. Many variations can be effected in the various compositions, methods and processes, without exceeding the scope of the invention.

I claim:

1. An electrical device for generating clock signals of different frequencies to transpose or distort an input voice signal into another voice signal, comprising:

- an analog to digital converter connected to an amplifier for converting an input signal from said amplifier into a digital signal;
- a memory unit connected with said analog to digital converter for the storage of said digital signal;
- a digital to analog converter connected to said memory unit for converting said stored digital signal into an analog signal;
- a clock generator for generating an encoding clock and a decoding clock of different frequencies; said encoding clock and decoding clock respectively sent to said A/D converter and said D/A converter to actuate the operation thereof;
- a multiplexer connected to said memory unit;
- a write address counter controlled by said encoding clock, and connected to and actuating said multiplexer to send writing instructions to said memory unit for writing said digital signal from said A/D converter;
- a read address counter controlled by said decoding clock, and connected to and actuating said multiplexer to send reading instructions to said memory unit reading said stored digital signal to said D/A converter; and whereby said stored digital signal is over-read in said memory unit, when a transmitting frequency of said decoding clock is higher than a receiving frequency of said encoding clock; and said stored digital signal is over-written in said memory unit, when said transmitting frequency is lower than said receiving frequency.

2. An electrical device according to claim 1, wherein said memory unit is a static random access memory.

3. An electrical device according to claim 1, wherein said memory unit is a dynamic random access memory.

4. An electrical device according to claim 1, wherein said memory unit is a register.

5. An electrical device according to claim 1, wherein said analog to digital converter and said digital to analog converter employ a continuous variable-slope data modulation encoder.

6. An electrical device according to claim 1, wherein said analog to digital converter and said digital to analog converter employ a adaptive delta modulation.

7. An electrical device according to claim 1, wherein said analog to digital converter and said digital to analog converter employ a delta modulation.

8. An electrical device according to claim 1, wherein said clock generator comprises an oscillator, a timing generator connected to said oscillator, and a programmable logic array connected to said timing generator and controlled by a switch array to generate two clocks of different frequencies.

9. An electrical device according to claim 1, wherein said clock generator comprises an oscillator connected to said oscillator, a timing generator and a logic array connected to said timing generator and controlled by a switch array to generate two clocks of different frequencies.

* * * * *